United States Patent
Nicolai

[19]
[11] Patent Number: 5,198,707
[45] Date of Patent: Mar. 30, 1993

[54] INTEGRATED CIRCUIT WITH MODE DETECTION PIN FOR TRISTATE LEVEL DETECTION

[76] Inventor: Jean Nicolai, Résidence Laubassane B - Avenue Léo Lagrange, 13090 Aix En Provence, France

[21] Appl. No.: 705,375

[22] Filed: May 24, 1991

[30] Foreign Application Priority Data

May 30, 1990 [FR] France ................................ 90 06717

[51] Int. Cl.⁵ ..................... H03K 19/092; H03K 19/00
[52] U.S. Cl. .................................. 307/475; 307/303; 307/473; 307/465
[58] Field of Search ............... 307/475, 473, 465, 474; 365/189.03, 189.02, 230.02

[56] References Cited

U.S. PATENT DOCUMENTS

| | | | |
|---|---|---|---|
| 4,005,315 | 1/1977 | Blauschild | 307/473 |
| 4,100,429 | 7/1978 | Adachi | 307/473 |
| 4,115,706 | 9/1978 | Yamaguchi | 307/473 |
| 4,837,505 | 6/1989 | Mitsunobu | 324/158 R |
| 4,982,427 | 1/1991 | Nicolai | 379/406 |

FOREIGN PATENT DOCUMENTS

0141681 5/1985 European Pat. Off. .
153840 11/1981 Japan .
202628 11/1983 Japan .

OTHER PUBLICATIONS

"An Engineering Approach to Digital Design", William Fletcher, Prentice Hall, 1980, pp. 18–19.
"Hard Wired Information with Three Voltage Levels", IBM Technical Disclosure Bulletin, vol. 22, No. 5, Oct. 1979, Garcsa et al.

Primary Examiner—Edward P. Westin
Assistant Examiner—Richard Roseen
Attorney, Agent, or Firm—Groover & Bruning

[57] ABSTRACT

To enable a determined mode of operation, out of several possible modes, to be dictated from the exterior of an integrated circuit, there is provided a specific pin and a detector that is connected to the pin and is capable of detecting a logic level 0 or 1 or a high impedance state at this pin. The detector includes several switches and a resistor. It works in two successive phases and consumes no current at rest. A register memorizes the logic level of the pin during the two phases, and a decoder determines the state of the pin from the two memorized logic levels.

11 Claims, 1 Drawing Sheet

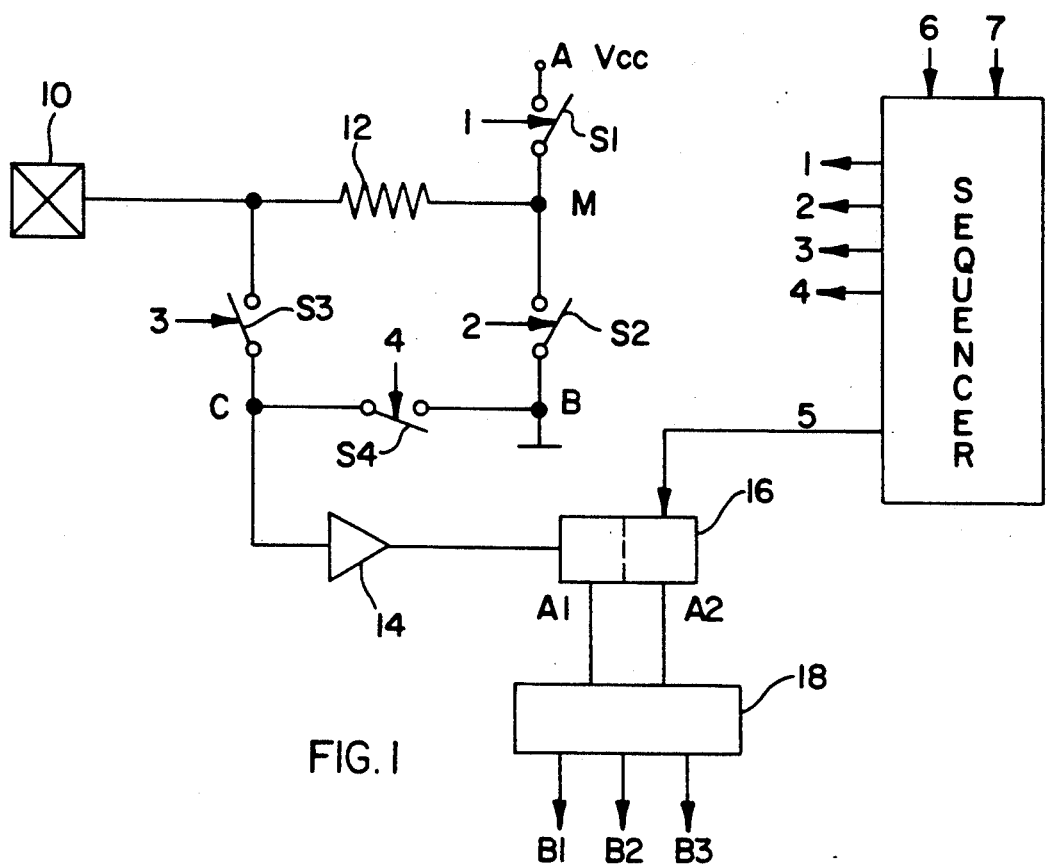
FIG. 1
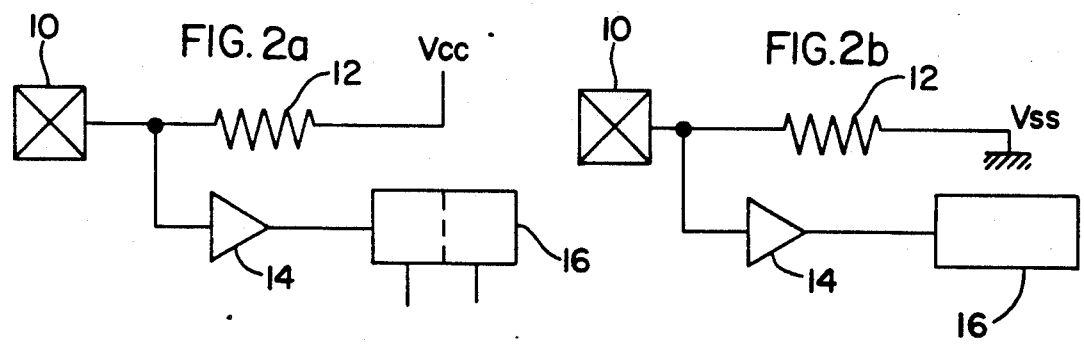

INTEGRATED CIRCUIT WITH MODE DETECTION PIN FOR TRISTATE LEVEL DETECTION

BACKGROUND OF THE INVENTION

1. Field of the Invention

The invention relates to integrated circuits. In many cases, and especially for complex integrated circuits, there needs to be one or more pins available that can be used for the definition, from the exterior, of a determined mode of operation of the circuit from among several possible modes. This is the case for microprocessors, memories and many other circuits corresponding to a variety of applications.

For example, it is desired to place the circuit either in test mode or in normal operation mode. Or, again, it is desired that the user should have several possible operating options, from among which he will choose one be means of a pin reserved for this purpose.

2. Description of the Prior Art

The standard approach is to apply a logic level 0 to 1 from the exterior to the pin, as a function of the chosen mode. A detector internal to the integrated circuit examines the state of the pin and gives the rest of the circuit an appropriate command that makes the circuit work in either one mode or another as a function of a logic level detected.

If the number of possible modes of operation is greater than 2, more than one pin is needed to define the desired mode.

This is the simplest approach. An approach that is more economical in terms of numbers of pins has been devised. It consists in providing for a detector capable of recognizing three possible states of the pin: logic state 0 or logic state 1, or high impedance state (pin unconnected or connected to a very high impedance). Thus, each pin enables the definition, from the exterior, of three possible modes of operation.

For a desired number of modes, the total number of pins of the integrated circuit is thus reduced. This is very important since the price of the integrated circuit is greatly affected by the price of the package, and the price of the package depends greatly on the number of pins. We may cite, for example, the case of a 20-pin circuit in which an additional pin would make it necessary, in fact, to change to a 24-pin circuit for there is no standard package available between a 20-pin package and a 24-pin package.

However, existing detectors used to detect either a logic level 0 or a logic level 1 or, again, a high impedance state, have the drawback of consuming a large amount of current not only during the detection but also in permanent operation mode.

SUMMARY OF THE INVENTION

An aim of the invention is to propose a simple, inexpensive circuit consuming little current (especially in permanent operation mode) to detect one among three states on a pin of an integrated circuit.

The integrated circuit according to the invention comprises the following: an input pin at which it is sought to detect one among three levels, a resistor connected to the pin, a set of switches connected between the pin, the resistor and two circuit nodes at potentials representing respectively a first and a second logic level, a register for memorizing a logic state, and a control means to control the switches in order to perform the following operations:

in a first reading phase, to connect the pin to one of the nodes by means of the resistor and, simultaneously, to connect the pin to the register to memorize, in this register, the logic level to which the pin is then taken, in a second reading phase, to connect the pin to the other node by means of the resistor, the circuit further including a means to give a signal defining the state of the pin, this signal resulting from a combination between the logic levels assumed by the pin during the two phases.

The register preferably memorizes the two logic levels taken by the pin during the two phases. The register then has two outputs that are transmitted to a decoder which gives the desired output signal used to dictate a mode of operation of the integrated circuit as a function of the state of the pin.

Preferably, according to the invention, there is provision for a buffer stage to be interposed between the pin and the register, and a switch is provided to disconnect the pin from the input of the buffer stage outside the two reading phases and then to keep this input at a high or low logic state outside the two reading phases.

Preferably, the set of switches includes:

a first switch and a second switch in series between two supply terminals of the integrated circuit, the resistor being connected between the pin and the midpoint of the two switches, a third switch to connect the pin to the register, and a fourth switch to connect the register to a supply terminal.

The integrated circuit is preferably made by CMOS technology to limit the consumption of current to the maximum extent.

BRIEF DESCRIPTION OF THE DRAWINGS

Other features and advantages of the invention shall appear from the following detailed description and from the appended drawings, wherein:

FIG. 1 shows the state detector according to the invention,

FIG. 2a shows the configuration of the detector during the first reading phase,

FIG. 2b shows the configuration of the detector during the second reading phase, FIG. 2c shows the configuration of the detector outside the two reading phases.

DETAILED DESCRIPTION OF THE INVENTION

FIG. 1 shows the preferred embodiment of the invention.

The pin used to define a mode of operation of the integrated circuit from the exterior is designated by the reference 10. It can be placed, by external action, in three possible states: the low logic state corresponding to a voltage logic level that is, for example, the level of a first supply terminal of the integrated circuit (Vss), a high logic state corresponding to a logic level which is that of a second supply voltage (Vcc) or, again, a high impedance state where the pin is unconnected or connected to the exterior of the circuit at a very high impedance.

The pin 10 is connected, inside the integrated circuit, to a state detector essentially comprising a resistor, switches and a means to detect the logic level at the pin in two different configurations of the switches.

More precisely, the state detector includes a resistor 12 connected by one side to the pin 10 and, by the other side, to the midpoint M of a series assembly of two switches S1 and S2.

The switch S1 is also connected to a node A, the potential of which corresponds to the high logic level. Preferably, the node A is quite simply at the high supply potential Vcc. By contrast, the switch S2 is connected to a node B, the potential of which corresponds to the low logic level. Preferably, the node B is at the low supply potential Vss.

The pin 10 is also connected, by means of a third switch S3, to a node C that constitutes an input of a buffer amplifier 14, the output of which is connected to a register 16 enabling the recording of the logic level present at the node C.

A fourth switch enables the node C to be placed at one of the supply potentials, herein the low potential Vss.

Finally, the detector has a sequencer to control the closing and opening of the switches in a cycle that shall be described in detail further below, and a small logic circuit 18 to give, on the basis of the contents of the register 16, a signal representing the state of the pin, hence a signal representing the mode of operation that is to be imposed from the exterior.

The sequencer delivers the following control signals:

outside the reading phases, i.e. outside the instants when it is desired to determine the state of the pin, the switch S4 is closed and the switches S1, S2, S3 are open. Thus, there is no current consumption possible through the pin 10. Besides, in keeping the input of the buffer amplifier at Vss through S4, the consumption of the amplifier 14 is minimized for CMOS circuits that consume no current at rest. Indeed, there would be a risk that the amplifier might consume a non-negligible amount of current if the potential at its input were to be floating;

during the phases for reading the state of the pin, the switch S4 is open and the switch S3 is closed. The reading phases can be broken down into a first phase, during which the switch S1 is closed and the switch S2 is open, and a second phase during which the switch S2 is closed and the switch S1 is open (the phases may be inverted).

During the first reading phase, a configuration shown in FIG. 2a is obtained, wherein the pin is connected, firstly, to the input of the amplifier 14 and, secondly, to Vcc by means of the resistor 12. If the pin is kept, from the exterior, at the low logic level Vss, it is this level that is transmitted through the amplifier 14 to the register 16. The register memorizes this level. If the pin is at Vcc, it is the high logic level that is transmitted and memorized in the register. If, finally, the pin is at the exterior in high impedance, it is connected to Vcc by the resistor, the value R of which is far smaller than the external high impedance. It is therefore still the high logic level Vcc that is transmitted and memorized in the register 16.

During the second reading phase, the circuit configuration of FIG. 2b is obtained. In this case, if the pin is kept externally at Vss or Vcc, it is again the low level or high level respectively that is transmitted to the register 16. However, if the pin is at high impedance, it takes the low logic level since it is connected to Vss by the resistor 12.

At the end of the second reading phase, if the information collected in the two reading phases is combined, it is possible to define the state of the pin: if we have a low state twice in the register, it means that the pin was in the low state. If we have a high state twice, it means that the pin was in a high state. But if we have a high state once and a low state once, it means that the pin was in high impedance during the reading.

The outputs A1 and A2 of the register, representing the logic states of the pin during the two phases of reading, are therefore combined in a small logic circuit 18 which is a decoder giving, for example, three outputs B1, B2, B3, each representing a respective state of the pin 10. These outputs B1, B2, B3 are used to modify internal functions of the integrated circuit, to make it go into a particular mode of operation.

Should there be several pins used to define a mode, each pin is attached to a detector such as that of FIG. 1, but the logic circuit 18 may be a common circuit decoding the combination of states read in the registers such as 16.

For example, the resistor 12 may have a value of the order of 12 kilo-ohms, but its value is not of critical importance, provided it is low enough to really draw the pin to the potential Vss or Vcc when the pin is at high impedance, and not low enough to impede the maintaining of the pin, from the exterior, at a determined potential when the pin is not in high impedance.

Outside the reading mode, there is no current consumption (in CMOS technology). The configuration of the circuit is that of FIG. 2c. During the reading, there is a small consumption of current due to the potential Vcc-Vss that may flow through the resistor when the pin is at the potential Vss or Vcc.

What is claimed is:

1. A CMOS integrated circuit, comprising:
   first and second power supply nodes;
   a first input pin;
   state detection circuitry, connected to said first input pin, comprising
      a single resistor, and
      a plurality of switches connected to said first input pin and to said resistor and to a register, and connected to be controlled by sequencing logic such that:
      in a first state of said switches,
         said resistor is connected between said input pin and said first power supply node, and
         said input pin is operatively connected to an input of said register;
      in a second state of said switches,
         said resistor is connected between said input pin and said second power supply node, and
         said input pin is operatively connected to an input of said register; and
      in a third state of said switches, said input of said register is connected to said second power supply node and not to the input pin; and
   wherein said sequencing logic also controls said register to selectably provide an output corresponding to values received during said first and second states.

2. The integrated circuit of claim 1, wherein said resistor has a value of the order of 12 KΩ.

3. The integrated circuit of claim 1, wherein said register has a serial input.

4. The integrated circuit of claim 1, wherein said register provides a first output bit corresponding to the value received during said first state, and a second output bit corresponding to the value received during said second state.

5. The integrated circuit of claim 1, wherein said register provides a first output bit corresponding to the value received during said first state, and a second output bit corresponding to the value received during said second state; and further comprising decoding logic, connected to receive said two output bits of said register, and to drive one of three output lines accordingly.

6. A method for discriminating among three states of an integrated circuit input pin, using a single resistor, comprising the steps of:
(a) when it is desired to determine the state of the pin, then
  (a)(1) connecting the resistor between the pin and a power supply voltage, and simultaneously connecting the pin to an input of a buffer, and registering an output of said buffer to provide a first bit; and
  (a)(2) connecting the resistor between the pin and ground, and simultaneously connecting the pin to the input of said buffer, and registering the output of said buffer to provide a second bit; and
  (a)(3) decoding said first and second bits to determine the state of the pin; and
(b) at all other times, not connecting the resistor between the pin and ground nor between the pin and the power supply voltage, and disconnecting the pin from the input of said buffer.

7. The method of claim 6, wherein said step (a)(1) is performed before step (a)(2).

8. The method of claim 6, wherein said resistor has a value of the order of 12 K$\Omega$.

9. A method for discriminating among three states of an integrated circuit input pin, using a single resistor, comprising the steps of:
(1) connecting the resistor between the pin and a power supply voltage, and simultaneously connecting the pin to an input of a buffer, and registering an output of said buffer to provide a first bit; and
(2) connecting the resistor between the pin and ground, and simultaneously connecting the pin to the input of said buffer, and registering the output of said buffer to provide a second bit; and
(3) decoding said first and second bits to determine the state of the pin.

10. The method of claim 9, wherein said step (1) is performed before said step (2).

11. The method of claim 9, wherein said resistor has a value of the order of 12 K$\Omega$.

* * * * *